(12) United States Patent
Furukawa et al.

(10) Patent No.: US 10,976,370 B2
(45) Date of Patent: Apr. 13, 2021

(54) SOC ESTIMATION DEVICE OF ENERGY STORAGE DEVICE, ENERGY STORAGE APPARATUS, AND SOC ESTIMATION METHOD OF ENERGY STORAGE DEVICE

(71) Applicant: GS YUASA INTERNATIONAL LTD., Kyoto (JP)

(72) Inventors: Kazuki Furukawa, Kyoto (JP); Tsubasa Matsuyoshi, Kyoto (JP); Suguru Kozono, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 91 days.

(21) Appl. No.: 16/337,615

(22) PCT Filed: Sep. 28, 2017

(86) PCT No.: PCT/JP2017/035238
§ 371 (c)(1),
(2) Date: Mar. 28, 2019

(87) PCT Pub. No.: WO2018/062394
PCT Pub. Date: Apr. 5, 2018

(65) Prior Publication Data
US 2020/0033415 A1    Jan. 30, 2020

(30) Foreign Application Priority Data
Sep. 29, 2016  (JP) .............................. JP2016-191764

(51) Int. Cl.
*G01R 31/36* (2020.01)
*G01R 31/389* (2019.01)
(Continued)

(52) U.S. Cl.
CPC .............. *G01R 31/36* (2013.01); *B60L 50/60* (2019.02); *G01R 31/389* (2019.01);
(Continued)

(58) Field of Classification Search
CPC combination set(s) only.
See application file for complete search history.

(56) References Cited

U.S. PATENT DOCUMENTS

2008/0136378 A1   6/2008  Iwahana et al.
2012/0007556 A1   1/2012  Matsui et al.
(Continued)

FOREIGN PATENT DOCUMENTS

EP    2339361 A2   6/2011
EP    2579381 A1   4/2013
(Continued)

OTHER PUBLICATIONS

WIPO Application No. PCT/JP2017/035238, PCT International Search Report dated Dec. 19, 2017.
(Continued)

*Primary Examiner* — Patrick Assouad
*Assistant Examiner* — Taqi R Nasir
(74) *Attorney, Agent, or Firm* — Alston & Bird LLP

(57) ABSTRACT

An SOC estimation device 50 of an energy storage device includes a storage unit 73 and a data processing unit 71. The energy storage device 100 has a characteristic including a first deterioration mode in which a capacity drop with respect to time indicates a first transition, and a second deterioration mode in which a capacity drop indicates a second transition. The storage unit 73 holds first correlation data M1 indicating a correlation between SOC and OCV of the energy storage device in the first deterioration mode, and second correlation data M2 indicating a correlation between SOC and OCV of the energy storage device in the second deterioration mode. The data processing unit 71 executes a mode determination process of determining a deterioration mode of the energy storage device, and an estimation process of selecting correlation data corresponding to the
(Continued)

deterioration mode from the storage unit, to estimate SOC of the energy storage device.

13 Claims, 16 Drawing Sheets

(51) Int. Cl.
*G01R 31/392* (2019.01)
*H01M 10/48* (2006.01)
*H02J 7/00* (2006.01)
*B60L 50/60* (2019.01)
*B60K 6/28* (2007.10)

(52) U.S. Cl.
CPC .......... *G01R 31/392* (2019.01); *H01M 10/48* (2013.01); *H02J 7/0021* (2013.01); *B60K 6/28* (2013.01); *B60Y 2200/91* (2013.01); *B60Y 2200/92* (2013.01); *H01M 2220/20* (2013.01)

(56) References Cited

U.S. PATENT DOCUMENTS

| | | | | |
|---|---|---|---|---|
| 2013/0076363 A1* | 3/2013 | Takahashi | ............ | G01R 31/387 324/427 |
| 2013/0099794 A1* | 4/2013 | Takahashi | ............ | H01M 10/48 324/427 |
| 2014/0217982 A1* | 8/2014 | Ohkawa | ............ | H02J 7/0014 320/118 |
| 2015/0301123 A1 | 10/2015 | Tao et al. | | |
| 2015/0357852 A1* | 12/2015 | Nakao | ............ | G01R 31/3842 320/162 |
| 2016/0252582 A1* | 9/2016 | Iida | ............ | H01M 10/4285 702/63 |
| 2016/0259010 A1 | 9/2016 | Syouda | | |

FOREIGN PATENT DOCUMENTS

| | | | |
|---|---|---|---|
| JP | 2002-286818 | A | 10/2002 |
| JP | 2004-354050 | A | 12/2004 |
| JP | 2005-274214 | A | 10/2005 |
| JP | 2011-133443 | A | 7/2011 |
| JP | 2011-258337 | A | 12/2011 |
| JP | 2012-008134 | A | 1/2012 |
| JP | 2012-135168 | A | 7/2012 |
| JP | 2014-032825 | A | 2/2014 |
| JP | 2014-041768 | A | 3/2014 |
| JP | 2014-073389 | A | 4/2014 |
| JP | 2014-109477 | A | 6/2014 |
| JP | WO2015025212 A1 * | | 2/2015 ............... G01R 1/36 |
| JP | 2015-040832 | A | 3/2015 |
| JP | 2015-108579 | A | 6/2015 |
| JP | 2015-117951 | A | 6/2015 |
| WO | WO 2014/156265 | A1 | 10/2014 |
| WO | WO 2015/025212 | A1 | 2/2015 |

OTHER PUBLICATIONS

European Patent Office, European Search Report for European Patent Application No. 17856343.3, dated Aug. 28, 2019, (8 pages), Munich, Germany.

* cited by examiner

Fig. 11

| | Capacity retention ratio Y [%] | SOC-OCV correlation map M |
|---|---|---|
| First deterioration mode | | Correlation map M1 |
| Second deterioration mode | Ya | Correlation map M2a |
| | Yb | Correlation map M2b |
| | Yc | Correlation map M2c |

(A) At low SOC, 25°C (B) At medium SOC, 25°C

| OCV[V] | SOC[%] |
|---|---|
| OCV1 | SOC1 |
| OCV2 | SOC2 |
| OCV3 | SOC3 |
| OCV4 | SOC4 |
| OCV5 | SOC5 |

SOC ESTIMATION DEVICE OF ENERGY STORAGE DEVICE, ENERGY STORAGE APPARATUS, AND SOC ESTIMATION METHOD OF ENERGY STORAGE DEVICE

CROSS REFERENCE TO RELATED APPLICATIONS

This application is a National Stage Application, filed under 35 U.S.C. § 371, of International Application No. PCT/JP2017/035238, filed Sep. 28, 2017, which claims priority to Japanese Application No. 2016-191764, filed Sep. 29, 2016; the contents of which are hereby incorporated by reference in their entirety.

BACKGROUND

Technical Field

The present invention relates to an SOC estimation device of an energy storage device capable of charge-discharge, an energy storage apparatus, and an SOC estimation method for an energy storage device.

Conventionally, there are known various methods for estimating SOC in an energy storage device capable of charge-discharge. Japanese Patent Publication JP-A-2015-117951 describes a point of estimating SOC by utilizing a correlation between SOC and OCV. Note that SOC is a state of charge and OCV is an open circuit voltage.

Japanese Patent Publication JP-A-2014-109477 describes a point that there are a first deterioration state in which deterioration is gentle and a second deterioration state in which deterioration is sharp, for an energy storage device. Then, prolonging of battery life is achieved by limiting an upper limit voltage for charge, in accordance with the deterioration state. Note that, in Japanese Patent Publication JP-A-2014-109477, the degradation state is determined by comparing a second capacity change quantity with a threshold value.

BRIEF SUMMARY

Energy storage devices such as lithium ion batteries have become widespread in automotive use. In the future, a situation is assumed in which an energy storage device after being used in automobile use (first use) is removed from the automobile and used for another purpose (second use). Therefore, even in the second use, a technique for accurately estimating SOC of the energy storage device is required. Further, even in a case of being used for the same purpose of use, it is preferable to accurately estimate SOC of the energy storage device regardless of a use period or a use situation.

The present invention has been made on the basis of the above circumstances, and it is an object of the present invention to improve estimation accuracy of SOC.

An SOC estimation device of an energy storage device disclosed in this specification includes a storage unit and a data processing unit. The energy storage device has a characteristic including a first deterioration mode in which a capacity drop with respect to time indicates a first transition, and a second deterioration mode in which a capacity drop indicates a second transition. The storage unit holds first correlation data indicating a correlation between SOC and OCV of the energy storage device in the first deterioration mode, and second correlation data indicating a correlation between SOC and OCV of the energy storage device in the second deterioration mode. The data processing unit executes a mode determination process of determining a deterioration mode of the energy storage device, and an estimation process of selecting correlation data corresponding to the deterioration mode from the storage unit, to estimate SOC of the energy storage device.

Meanwhile, the technique disclosed in this specification can be applied to an energy storage apparatus and an SOC estimation method.

According to the SOC estimation device disclosed in this specification, estimation accuracy of SOC can be improved.

BRIEF DESCRIPTION OF THE FIGURES

FIG. 11 is a view showing storage contents of a memory.

DETAILED DESCRIPTION OF VARIOUS EMBODIMENTS

Figure 1:
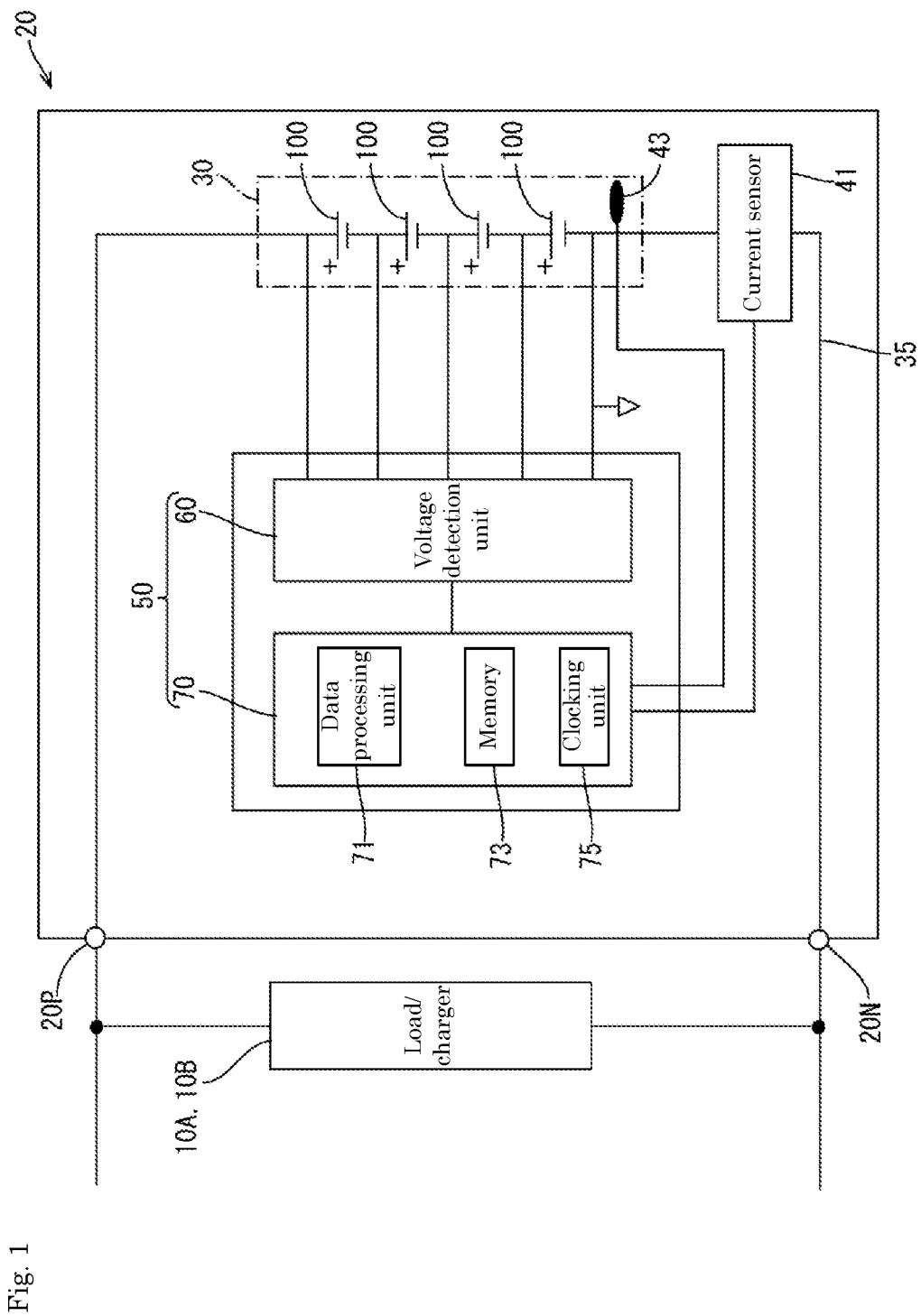
FIG. 1 is a block diagram showing an electrical configuration of a battery pack according to a first embodiment.

First, an outline of an SOC estimation device disclosed in this embodiment will be described.

The SOC estimation device of an energy storage device includes a storage unit and a data processing unit. The energy storage device has a characteristic including a first deterioration mode in which a capacity drop with respect to time indicates a first transition, and a second deterioration mode in which a capacity drop indicates a second transition. The storage unit holds first correlation data indicating a correlation between SOC and OCV of the energy storage device in the first deterioration mode, and second correlation data indicating a correlation between SOC and OCV of the energy storage device in the second deterioration mode. The data processing unit executes a mode determination process of determining a deterioration mode of the energy storage device, and an estimation process of selecting correlation data corresponding to the deterioration mode from the storage unit, to estimate SOC of the energy storage device. In this configuration, correlation data corresponding to the deterioration mode is selected from a plurality of correlation data indicating the correlation between SOC and OCV stored in the storage unit, and SOC of the energy storage device is estimated. Therefore, the estimation accuracy of SOC can be improved.

The data processing unit may determine a deterioration mode of the energy storage device on the basis of an internal resistance of the energy storage device in the mode determination process. Since the internal resistance of the energy storage device can be calculated from a voltage and a current of the energy storage device, it is possible to determine the deterioration mode without using a special sensor.

In the mode determination process, the data processing unit may determine a deterioration mode of the energy storage device on the basis of a resistance increase rate of the internal resistance of the energy storage device when SOC is lower than a first threshold, and on the basis of a resistance increase rate of the internal resistance of the energy storage device when SOC is higher than a second threshold larger than the first threshold. In the second deterioration mode, the resistance increase rate of the energy storage device is particularly large when SOC is low as compared with that when SOC is high. Therefore, by examining the resistance increase rate of the energy storage device for both the case where SOC is high and the case where SOC is low, it is possible to determine the deterioration mode with high accuracy.

The second deterioration mode is a deterioration mode in which a capacity drop is larger than that in the first deterioration mode, and the correlation of SOC-OCV is different in accordance with a capacity retention ratio. The storage unit may hold correlation data indicating the correlation between SOC and OCV of the energy storage device for each capacity retention ratio of the energy storage device, for the second deterioration mode. Further, when the energy storage device is determined to be in the second deterioration mode, the data processing unit may select correlation data corresponding to the capacity retention, ratio to estimate SOC of the energy storage device. In this configuration, when it is determined to be the second deterioration mode, the correlation data corresponding to the capacity retention ratio is selected and SOC of the energy storage device is estimated. Therefore, it is possible to further improve the SOC estimation accuracy of the energy storage device in the second deterioration mode.

The data processing unit may calculate an internal resistance of the energy storage device on the basis of a measured value of a voltage and a current of the energy storage device. In this configuration, the internal resistance can be calculated from data of the current and the voltage that can be obtained relatively easily. In addition, the internal resistance can be calculated even during charge-discharge of the energy storage device.

The storage unit preferably holds the first correlation data and the second correlation data by a correlation map or an approximate expression indicating the correlation between SOC and OCV of the energy storage device. In this configuration, it is possible to obtain the first correlation data and the second correlation data by referring to the correlation map or the approximate expression.

First Embodiment

A first embodiment of the present invention will be described with reference to FIGS. 1 to 16.

1. Electrical Configuration of Battery Pack 20 and Configuration of Secondary Battery 100

FIG. 1 is a circuit diagram showing an electrical configuration of a battery pack 20. The battery pack 20 can be connected with a load 10A and a charger 10B via a positive electrode terminal 20P and a negative electrode terminal 20N that are external terminals. Note that the battery pack 20 is an example of the "energy storage apparatus" of the present invention.

The battery pack 20 is for a vehicle (e.g., for engine starting), and has an assembled battery 30, a current sensor 41, a temperature sensor 43, and a management device 50 that manages the assembled battery 30. The current sensor 41 is connected in series with the assembled battery 30 via a current flow path 35. In this example, the current sensor 41 is disposed on the negative electrode side.

The battery pack 20 may be for driving of an electric vehicle such as an electric vehicle (EV), a hybrid electric vehicle (HEV), a plug-in hybrid electric vehicle (PHEV), or the like.

The battery pack 20 may be a 48 V power supply that supplies power to a vehicle driving assistance and an auxiliary machine.

The assembled battery 30 is constituted of a plurality (four cells in this example) of lithium ion secondary batteries 100 in series connection. Note that the cell means one lithium ion secondary battery. Further, the lithium ion secondary battery 100 is an example of the "energy storage device" of the present invention, and the management device 50 is an example of the "SOC estimation device" of the present invention. The assembled battery 30 may be one in which a plurality of cells are connected in series and in parallel.

The current sensor 41 functions to detect a current flowing in the lithium ion secondary battery 100. The temperature sensor 43 is a contact type or a non-contact type, and functions to measure a temperature [° C.] of the lithium ion secondary battery 100. The temperature sensor 43 may measure a temperature in the vicinity of the assembled battery 30, or may measure a temperature of one specific cell or each of a plurality of cells.

The current sensor 41 and the temperature sensor 43 are electrically connected to the management device 50 by a signal line, and detection values of the current sensor 41 and the temperature sensor 43 are taken into the management device 50.

The management device 50 includes a voltage detection unit 60 and a control unit 70. The voltage detection unit 60 is connected to both ends of each lithium ion secondary battery 100 via a detection line, and functions to measure a voltage of each lithium ion secondary battery 100 and a total voltage of the assembled battery 30. The voltage detection unit 60 may measure only a total voltage of the assembled battery 30.

The control unit 70 includes: a data processing unit 71 including a CPU; a memory 73; and a clocking unit 75 that counts time. The data processing unit 71 monitors a current I of the assembled battery 30, and a voltage and a temperature of each lithium ion secondary battery 100 from outputs of the current sensor 41, the voltage detection unit 60, and the temperature sensor 43, and also estimates SOC of each lithium ion secondary battery 100. Note that the memory 73 is an example of the "storage unit" of the present invention.

The memory 73 stores each piece of information for monitoring a state of each lithium ion secondary battery 100, and each piece of information for estimating SOC. Note that the information for estimating SOC includes data of an initial value of SOC and data of an initial value of an internal resistance R of each lithium ion secondary battery 100. Further, in addition to this, correlation data indicating a correlation between SOC and OCV and the like are included.

Figure 2:
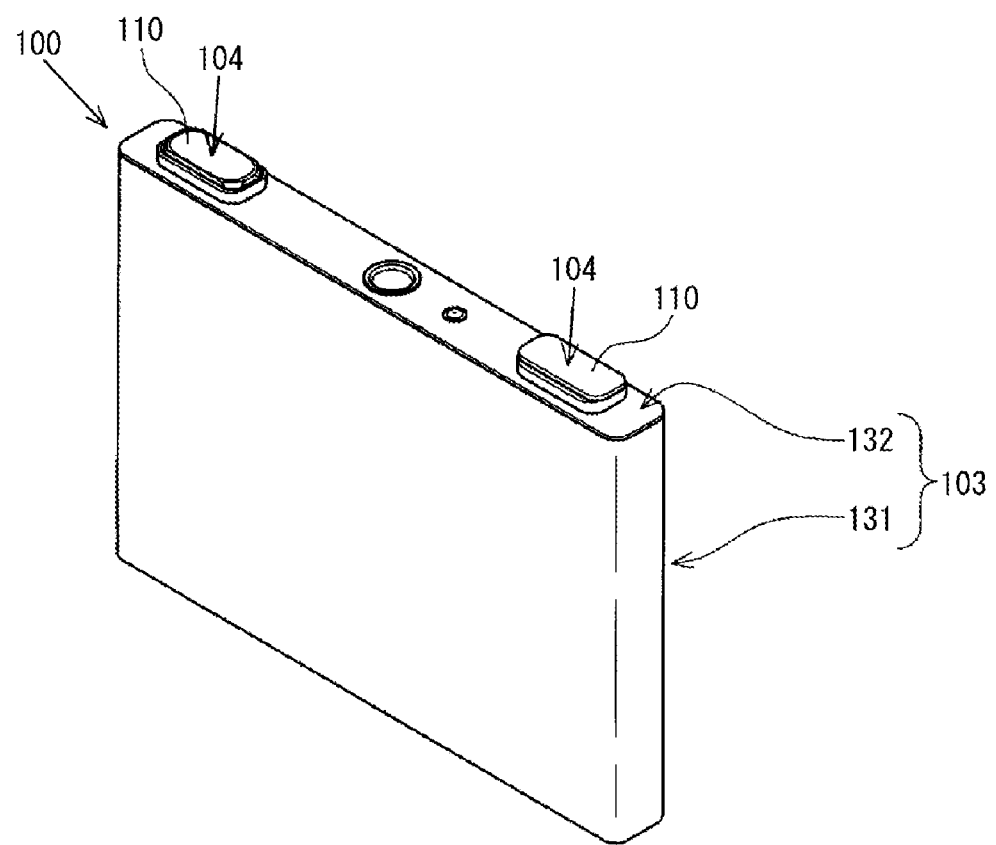
FIG. 2 is a perspective view of a lithium ion secondary battery.
Figure 2:
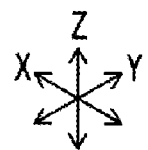
Figure 3:
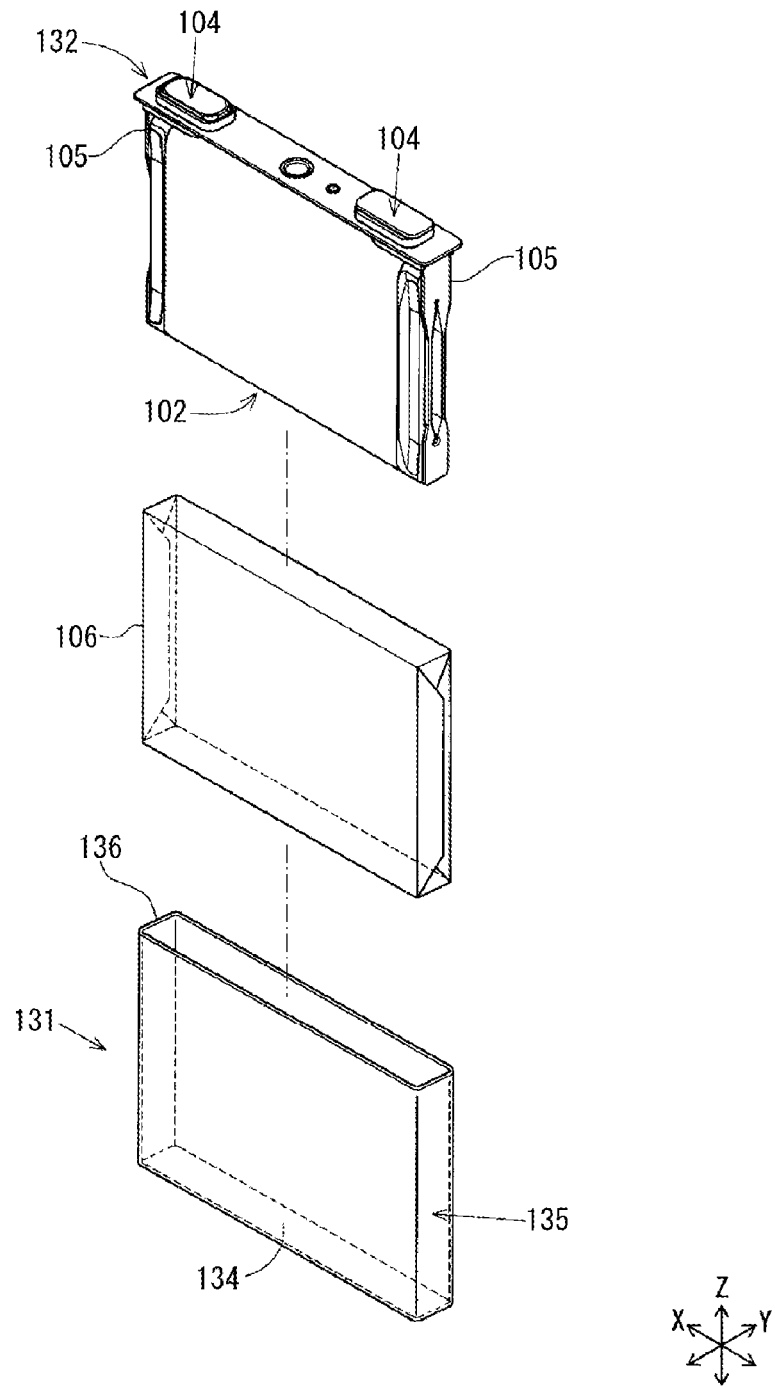
FIG. 3 is an exploded perspective view of the lithium ion secondary battery.
Figure 4:
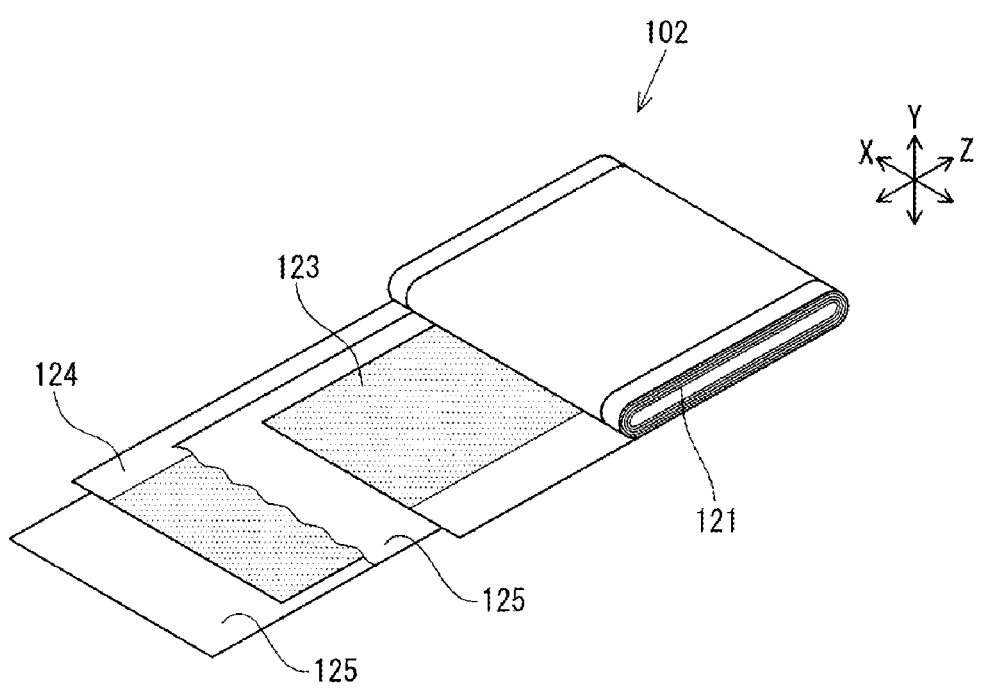
FIG. 4 is a view for explaining an electrode assembly of the lithium ion secondary battery.
Figure 5:
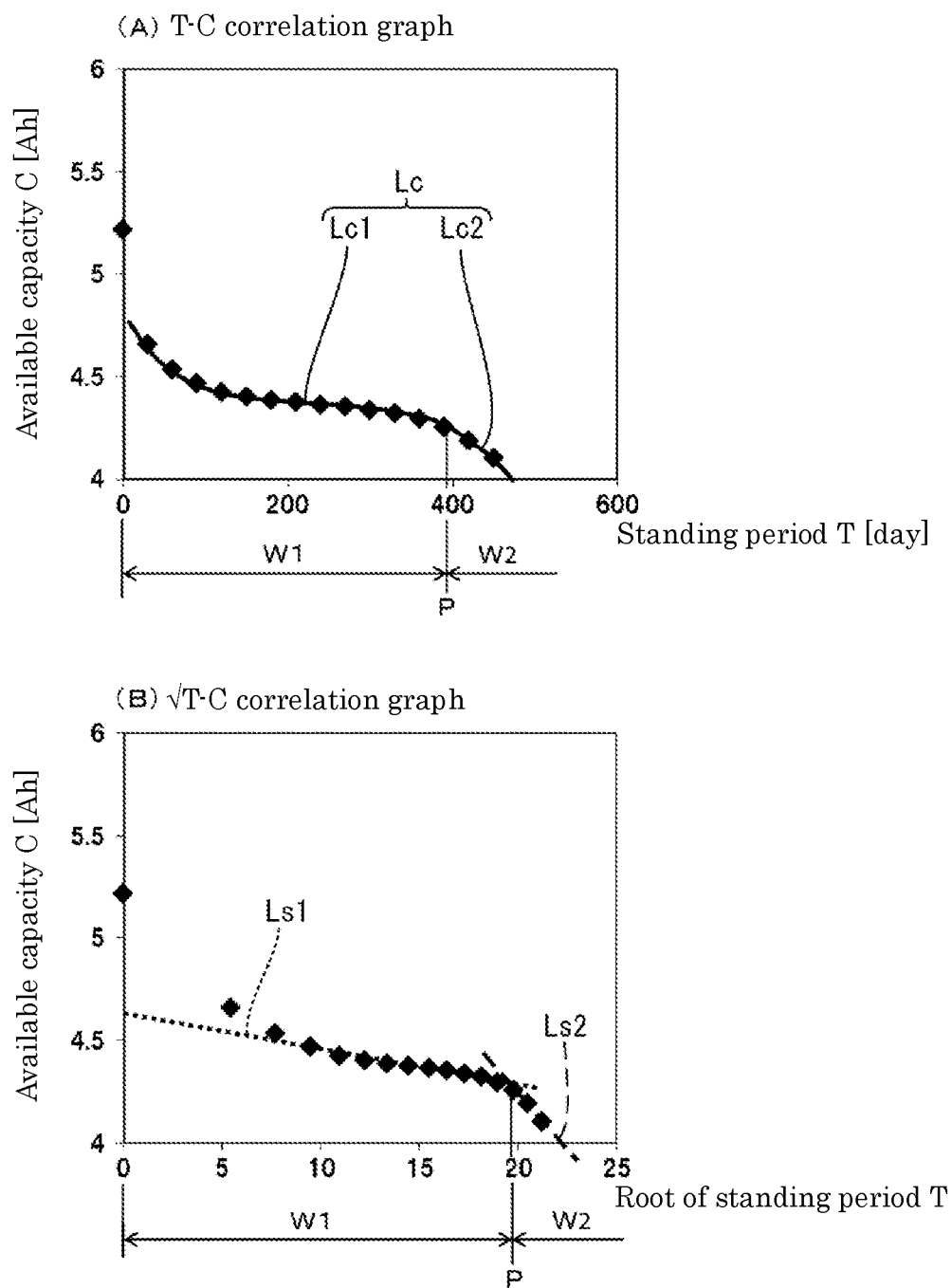
FIG. 5 is a graph showing a change in an available capacity with respect to a standing period.

As shown in FIGS. 2 to 4, the secondary battery 100 includes an electrode assembly 102 including a positive electrode 123 and a negative electrode 124, a case 103 accommodating the electrode assembly 102, and an external terminal 104 arranged outside the case 103. Further, the secondary battery 100 also has a current collector 105 that electrically connects the electrode assembly 102 and the external terminal 104.

The electrode assembly 102 includes a winding core 121, and the positive electrode 123 and the negative electrode 124 wound around the winding core 121 in a state of being insulated from each other. The winding core need not be provided. As lithium ions move between the positive electrode 123 and the negative electrode 124 in the electrode assembly 102, the secondary battery 100 is charged and discharged.

The positive electrode 123 has a metal foil and a positive active material layer formed on the metal foil. The metal foil is strip-shaped. The metal foil of the present embodiment is, for example, an aluminum foil. The negative electrode 124 has a metal foil and a negative active material layer formed on the metal foil. The metal foil is strip-shaped. The metal foil of the present embodiment is, for example, a copper foil.

In the electrode assembly 102, the positive electrode 123 and the negative electrode 124 configured as described above are wound in a state of being insulated by a separator 125. That is, in the electrode assembly 102 of the present embodiment, the positive electrode 123, the negative electrode 124, and the separator 125 are wound in a stacked state. The separator 125 is a member having an insulating property. The separator 125 is disposed between the positive electrode 123 and the negative electrode 124. As a result, in the electrode assembly 102, the positive electrode 123 and the negative electrode 124 are insulated from each other. In addition, the separator 125 holds electrolyte solution in the case 103. As a result, lithium ions move between the positive electrode 123 and the negative electrode 124 alternately stacked with the separator 125 interposed therebetween, during charge-discharge of the secondary battery 100. The electrode assembly 102 is not limited to the winding type. The electrode assembly may be of a stack type in which a plate-shaped positive electrode, a separator, and a plate-shaped negative electrode are stacked.

The case 103 has a case main body 131 having an opening, and a cover plate 132 that blocks (closes) the opening of the case main body 131. This case 103 is formed by joining an opening peripheral part 136 of the case main body 131 and a peripheral part of the cover plate 132 in a state of being overlapped. This case 103 has an internal space defined by the case main body 131 and the cover plate 132. Then, the case 103 accommodates the electrolyte solution in the internal space together with the electrode assembly 102 and the current collector 105.

The case main body 131 includes a rectangular plate-shaped closing part 134 and a rectangular tube-shaped body part 135 connected to a periphery of the closing part 134. That is, the case main body 131 has a rectangular tube shape in which one end part in an opening direction (Z axis direction) is blocked (that is, a bottomed rectangular tube shape).

The cover plate 132 is a plate-shaped member that blocks the opening of the case main body 131. Specifically, the cover plate 132 has a contour shape corresponding to the opening peripheral part 136 of the case main body 131. That is, the cover plate 132 is a rectangular-shaped plate material. In this cover plate 132, the peripheral part of the cover plate 132 is overlapped with the opening peripheral part 136 of the case main body 131 so as to block the opening of the case main body 131. An outer case accommodating the electrode assembly and the current collector is not limited to the case 103, and may be a pouch (laminate outer case) including a metal layer and a resin layer, for example.

The external terminal 104 is a part to be electrically connected to an external terminal of another secondary battery, an external device, or the like. The external terminal 104 is formed of a member having conductivity. For example, the external terminal 104 is formed of a metal material having high weldability, such as an aluminum-based metal material such as aluminum or an aluminum alloy, or a copper-based metal material such as copper or a copper alloy.

The current collector 105 is disposed in the case 103, and directly or indirectly connected to the electrode assembly 102 so as to be energizable. This current collector 105 is formed of a member having conductivity, and is arranged along an inner surface of the case 103. The current collector 105 need not be provided. The electrode assembly 102 may be directly connected to the external terminal 104.

The lithium ion secondary battery 100 includes an insulating member 106 that insulates the electrode assembly 102 from the case 103. The insulating member 106 of the present embodiment has a bag shape. This insulating member 106 is disposed between the case 103 (specifically, the case main body 131) and the electrode assembly 102. The insulating member 106 of the present embodiment is formed of, for example, a resin such as polypropylene or polyphenylene sulfide. In the lithium ion secondary battery 100 of the present embodiment, the electrode assembly 102 (the electrode assembly 102 and the current collector 105) in a state of being accommodated in the bag-shaped insulating member 106 is accommodated in the case 103. The insulating bag 106 need not be provided.

2. Estimation Process of SOC

The data processing unit 71 of the management device 50 performs processing for estimating a state of charge (SOC) of each lithium ion secondary battery 100. In estimation of SOC, estimation can be made by adding a cumulative integrated value of the current I detected by the current sensor 41 to an initial value of SOC, as shown in the following Formula (1) (current integration method).

$$SOC = SOC_o + \int I dt / C \qquad (1)$$

Note that SOCo is an initial value of SOC, I is a current, and C is an available capacity of the lithium ion secondary battery.

In the current integration method, a measurement error of the current sensor 41 is accumulated. Therefore, the data processing unit 71 periodically estimates SOC of each lithium ion secondary battery 100 by using an OCV method, and resets the SOC value. Then, after the reset, SOC is estimated by the current integration method with SOC obtained by the OCV method as the initial value. Note that the OCV method is a method of estimating SOC on the basis of an open circuit voltage (OCV) of the lithium ion secondary battery 100, and uses a measured value of OCV and refers to correlation data indicating a correlation between SOC and OCV, to obtain SOC corresponding to OCV.

3. Deterioration Mode of Lithium Ion Secondary Battery 100

FIG. 5(A) is a T-C correlation graph of the lithium ion secondary battery 100, in which a horizontal axis is a standing period T and a vertical axis is an available capacity C [Ah]. FIG. 5(B) is a \ T-C correlation graph of the lithium ion secondary battery 100, in which a horizontal axis is a root (square root) of a standing period T and a vertical axis is an available capacity C [Ah]. The available capacity C is a capacity that can be taken out from a state where the lithium ion secondary battery 100 is fully charged. The standing period T is the number of days elapsed with the lithium ion secondary battery 100 in an unused state (non-energized state). Note that the lithium ion secondary battery 100 is a ternary lithium ion secondary battery using a lithium-containing metal oxide containing elements of Co, Mn, and Ni as a positive active material, and hard carbon as the negative electrode.

As shown in FIG. 5(A), in a change curve Lc of the available capacity C, transition is different in a first period W1 from the beginning of the production and a second period W2 thereafter, so that there are two deterioration modes. Specifically, a curve of a change curve Lc2 of the second period W2 is sharper than a change curve Lc1 of the first period W1, and a drop amount of the available capacity C with respect to the standing period T is larger in the second period W2 than that of the first period W1. Further, when the horizontal axis is taken as the route of the standing period T, the first change curve Lc1 and the second change curve Lc2 can be substantially approximated by straight lines, and an inclination of a second approximate straight line Ls2 approximating the second change curve Lc2 is larger than that of a first approximate straight line Ls1 approximating the first change curve Lc1, as shown in FIG. 5(B). Hereinafter, a deterioration mode according to the change curve Lc1 is defined as a first deterioration mode, and a deterioration mode according to the change curve Lc2 is defined as a second deterioration mode.

4. Estimation Factor of Deterioration Mode

Figure 6:
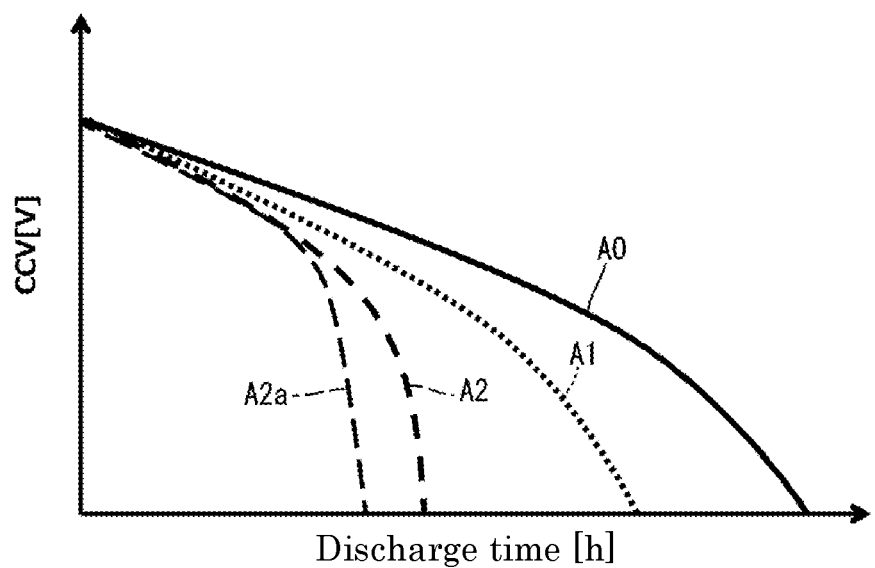
FIG. 6 is a graph showing a change in CCV with respect to a discharge time.

FIG. 6 is a graph in which a horizontal axis is a discharge time [h] and a vertical axis is CCV [V], and the graph is obtained by conducting a discharge test in which the ternary lithium ion secondary battery 100 is subjected to constant current discharge at a low rate. Note that a closed circuit voltage (CCV) is a closed circuit voltage of the lithium ion secondary battery 100.

The discharge test is conducted for each of an initial stage, the first deterioration mode, and the second deterioration mode, and "A0" indicates a discharge curve of the initial product. "A1" indicates a discharge curve in the first deterioration mode, and "A2" indicates a discharge curve in the second deterioration mode. Note that A2a is also a discharge curve in the second deterioration mode, but a capacity retention ratio Y of the battery is different from that in a case of A2 (described later).

As shown in FIG. 6, the discharge curve A1 of the first deterioration mode and the discharge curve A0 of the initial product have substantially the same shape, and the discharge curve A1 has a shape in which the discharge curve A0 is contracted in the horizontal axis direction. Whereas, the discharge curve A2 in the second deterioration mode has a different shape from the discharge curves A0 and A1, and shows a tendency of a larger change in CCV at the end of discharge.

Figure 7:
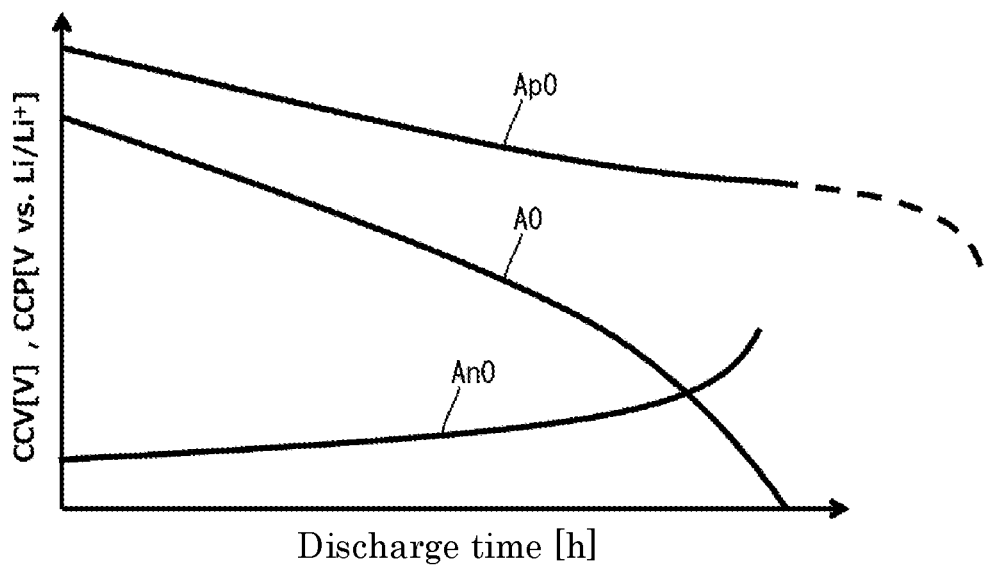
FIG. 7 is a graph showing changes in CCV and CCP with respect to a discharge time.

FIG. 7 is a graph in which a horizontal axis is a discharge period [h], and a vertical axis is CCV [V], CCP [V] of the positive electrode, and CCP [V] of the negative electrode, and the graph is obtained by conducting a discharge test in which the ternary lithium ion secondary battery 100 of the initial product is subjected to constant current discharge at a rate of 1 C. A curve A0 shown in FIG. 7 indicates a curve of CCV, a curve Ap0 indicates a curve of CCP of the positive electrode, and a curve An0 indicates a curve of CCP of the negative electrode. Note that CCV is a difference of a closed circuit potential (CCP) of the positive electrode and the negative electrode.

Figure 8:
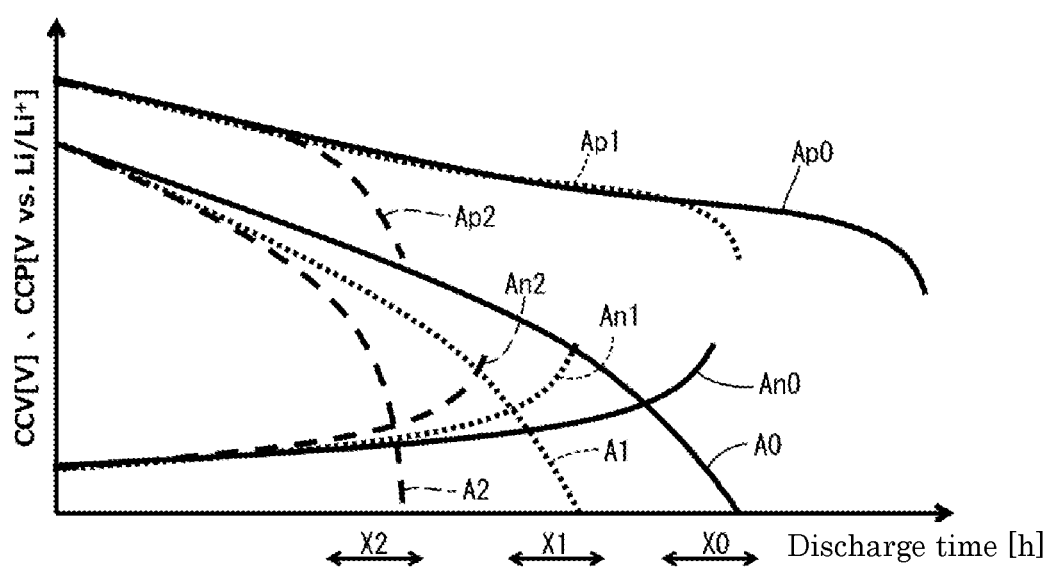
FIG. 8 is a graph showing changes in CCV and CCP with respect to a discharge time.

FIG. 8 shows a result of performing a similar discharge test for the first deterioration mode and the second deterioration mode. A curve A0, a curve Ap0, and a curve An0 shown in FIG. 8 respectively indicate a curve of CCV, a curve of CCP of the positive electrode, and a curve of CCP of the negative electrode, for the lithium ion secondary battery 100 in the initial stage. FIG. 8 shows a CCP transition of the positive electrode and the negative electrode, and an available capacity is determined by balance of the individual CCP transitions.

A curve A1, a curve Ap1, and a curve An1 respectively indicate a curve of CCV, a curve of CCP of the positive electrode, and a curve of CCP of the negative electrode, for the lithium ion secondary battery 100 in the first deterioration mode. A curve A2, a curve Ap2, and a curve An2 respectively indicate a curve of CCV, a curve of CCP of the positive electrode, and a curve of CCP of the negative electrode, for the lithium ion secondary battery 100 in the second deterioration mode.

As shown in FIGS. 7 and 8, in the lithium ion secondary battery 100 of the initial product, CCP of the negative electrode sharply changes greatly at the end of discharge X0 (curve An0). Further, similarly in the lithium ion secondary battery 100 in the first deterioration mode, CCP of the negative electrode sharply changes greatly at the end of discharge X1 (curve An1). Therefore, it is conceivable that the available capacity of the discharge curves A0 and A1 in the initial stage and first deterioration mode is rate-determined by resistance of the negative electrode.

Whereas, in the lithium ion secondary battery 100 in the second deterioration mode, CCP of the positive electrode sharply drops at the end of discharge X2 (curve Ap2). Therefore, it is conceivable that the available capacity of the discharge curve A2 in the second deterioration mode is rate-determined by resistance of the positive electrode. Note that rate-determination means what is dominant in determination of the characteristics.

5. Deterioration Mode, and DOD-CCV Characteristic and SOC-OCV Characteristic

Figure 9:
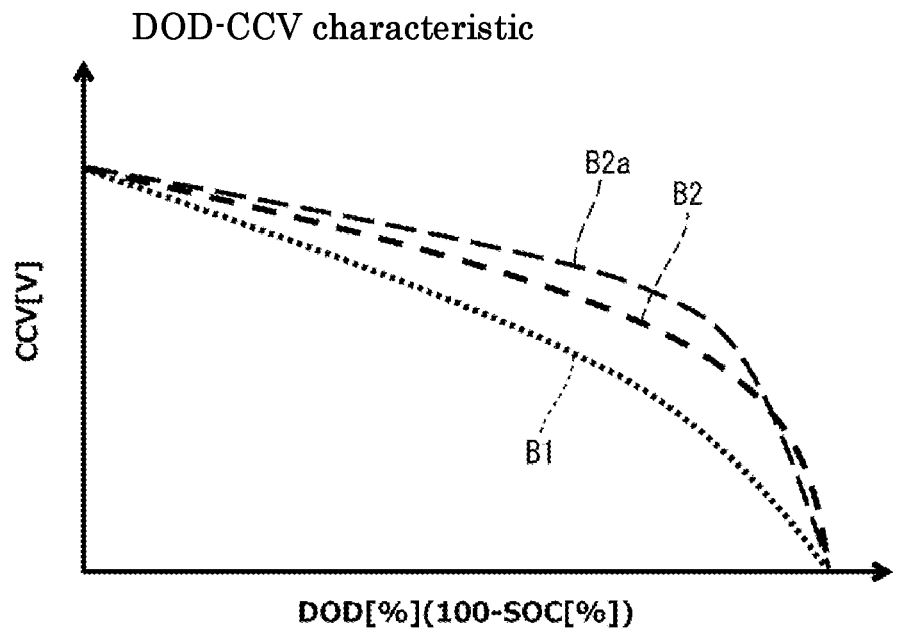
FIG. 9 is a graph showing a change in CCV with respect to DOD.

FIG. 9 is a DOD-CCV correlation graph in which a horizontal axis is DOD [%] and a vertical axis is CCV [V]. A depth of discharge (DOD) is a depth of discharge of the lithium ion secondary battery 100. The graph of FIG. 9 is obtained by conducting a discharge test in which the lithium ion secondary battery 100 is subjected to constant current discharge at a low rate similarly to the case of FIG. 6.

The discharge test is conducted for each of the initial stage, the first deterioration mode, and the second deterioration mode. "B1" indicates a DOD-CCV correlation curve in the first deterioration mode, while "B2" indicates a DOD-CCV correlation curve in the second deterioration mode. Note that the correlation curve in the initial stage is substantially coincident with the correlation curve B1 of the first deterioration mode.

As shown in FIG. 9, the DOD-CCV correlation curve B2 of the second deterioration mode is different from the DOD-CCV correlation curve B1 of the first deterioration mode. Specifically, the correlation curve B2 has a shape bulging outwardly from the correlation curve B1, and a voltage change at the end of discharge is large.

Transition of DOD-CCV is almost equal to transition of DOD-OCV under such a low-rate condition that the internal resistance R is very small and the internal resistance does not significantly change during the test, during discharge from a fully charged state. Then, transition of SOC-OCV becomes almost the same as transition in which transition of CCV is horizontally inverted at the DOD 50%. Therefore, as shown in FIG. 10, when the deterioration mode is different, the curve of the SOC-OCV characteristic of the lithium ion secondary battery 100 becomes different.

Figure 10:
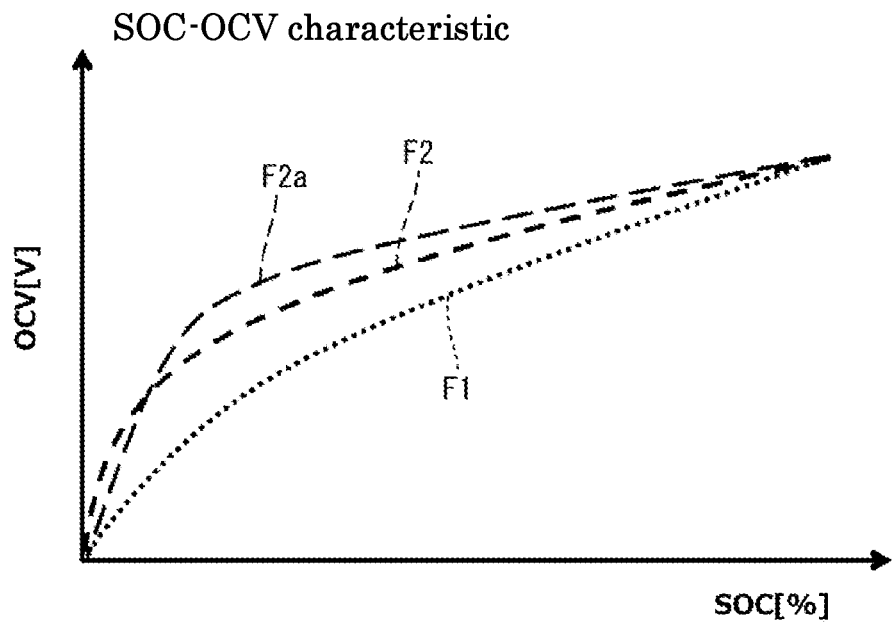
FIG. 10 is a graph showing a change in OCV with respect to SOC.

Specifically describing, "F1" shown in FIG. 10 indicates an SOC-OCV correlation curve in the first deterioration mode, while "F2" indicates an SOC-OCV correlation curve in the second deterioration mode.

The SOC-OCV correlation curve F2 of the second deterioration mode has a shape bulging outwardly from the correlation curve F1, and an OCV change at the end of discharge is large. Therefore, in the present embodiment, the correlation data indicating the correlation of SOC-OCV is stored in the memory 73 for each deterioration mode.

Specifically, as shown in FIG. 11, a correlation map M1 corresponding to the correlation curve F1 is stored corresponding to the first deterioration mode, and a correlation map M2 obtained by mapping a correlation curve F2 is stored corresponding to the second deterioration mode.

Then, by detecting the deterioration mode of the lithium ion secondary battery 100 and selecting a correlation map M, the estimation accuracy of SOC is improved. Note that the correlation map M is data obtained by associating a value of SOC for each OCV on the basis of the correlation curve F (see FIG. 16).

"B2a" shown in FIG. 9 indicates a difference in a capacity retention ratio Y with respect to "B2", and a correlation curve "F2a" shown in FIG. 10 indicates a difference in the capacity retention ratio Y with respect to the correlation curve "F2". The SOC-OCV correlation curve F2 of the second deterioration mode becomes a curve having a different shape due to the difference of the capacity retention ratio Y.

Therefore, as shown in FIG. 11, in the second deterioration mode, correlation maps M2a to M2c are stored for each of the capacity retention ratios Ya to Yc, and corresponding the correlation maps M2a to M2c are selected in accordance with the capacity retention ratio Y. The capacity retention ratio Y can be calculated from the following Formula (2).

$$Y = C/Co \times 100 \quad (2)$$

C: an available capacity of the lithium ion secondary battery 100, Co: an initial value of an available capacity (numerical value after manufacturing)

Note that, since the SOC-OCV correlation curve F1 of the first deterioration mode is almost the same curve regardless of the capacity retention ratio Y, only one type of the correlation map M1 is stored as shown in FIG. 11, for the first deterioration mode. Further, since the SOC-OCV correlation curve in the initial stage is substantially coincident with the SOC-OCV correlation curve F1 of the first deterioration mode, the correlation map M1 of the first deterioration mode can be used at the initial stage.

6. Detection Method of Deterioration Mode

Figure 12:
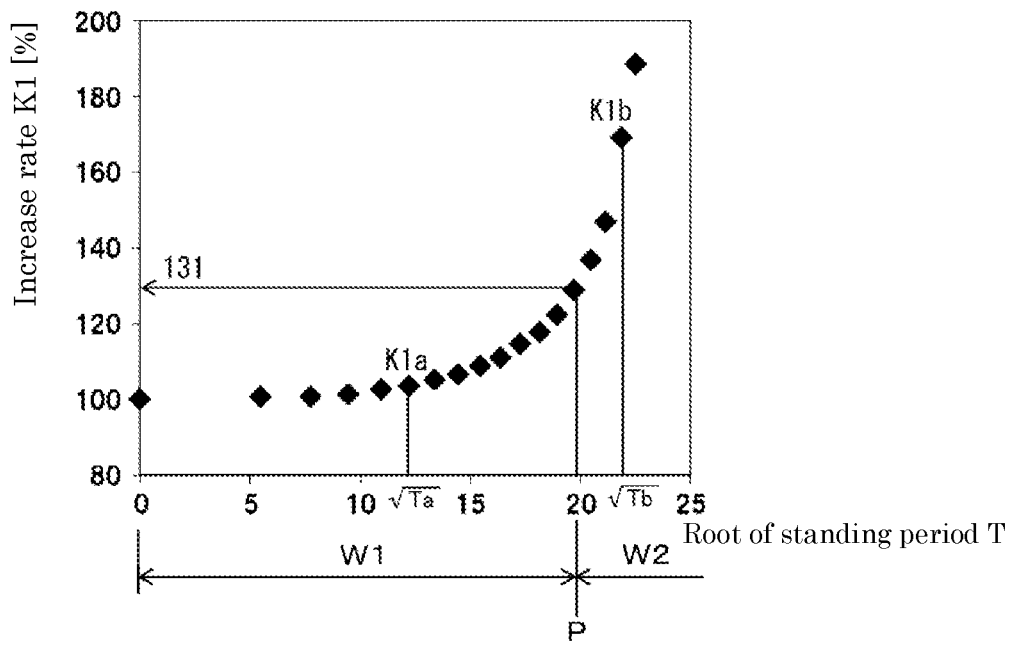
FIG. 12 is a graph showing a change in a resistance increase rate with respect to a standing period.
Figure 12:
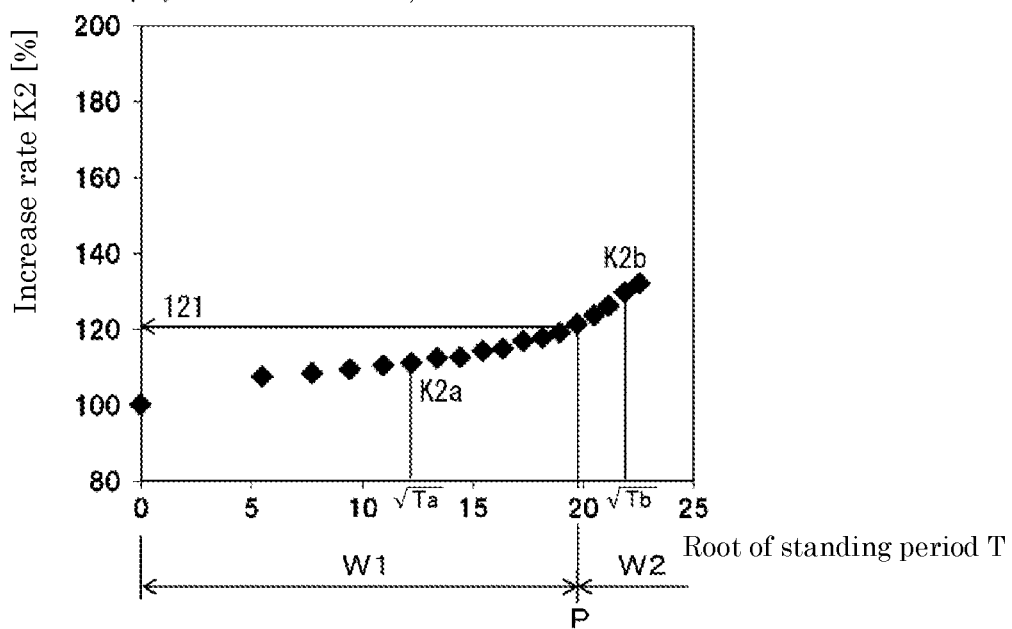
Figure 13:
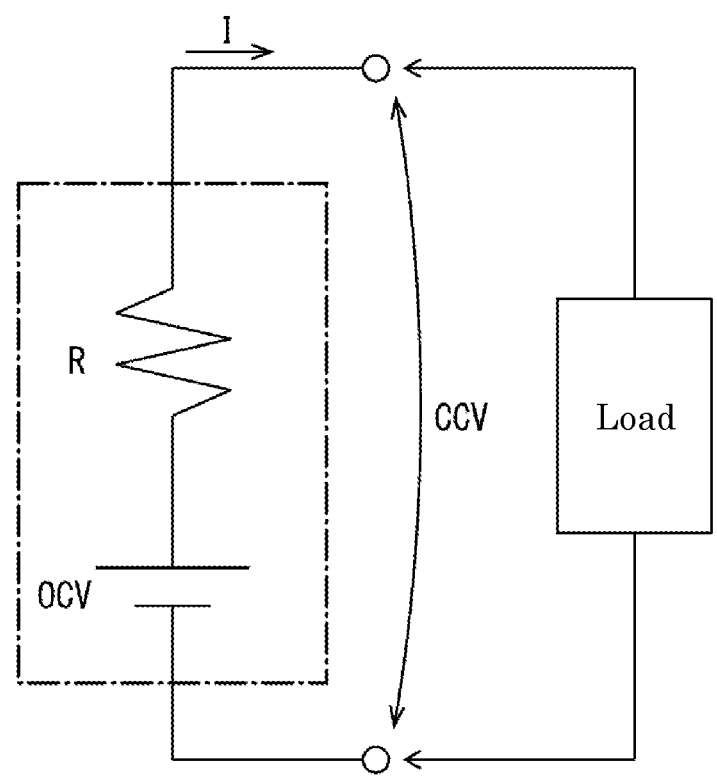
FIG. 13 is a diagram showing a detection principle of an internal resistance of a secondary battery.

FIG. 12 is a graph showing a change in a resistance increase rate (increase rate of an internal resistance based on an initial value) K with respect to the standing period T, and the graph is obtained from a test in which the lithium ion secondary battery 100 is left in a state close to the fully charged state (SOC 80%), and a resistance increase rate K after the standing period is measured for each SOC. Further, FIG. 12(A) shows a resistance increase rate K1 when the lithium ion secondary battery 100 is at low SOC (specifically, SOC 20%) at a temperature of 25° C., while FIG. 12(B) shows a resistance increase rate K2 when the lithium ion secondary battery 100 is at medium SOC (specifically, SOC 50%) at a temperature of 25° C. Note that, in the graphs in FIGS. 12(A) and 12(B), a horizontal axis is a route of the standing period T, and a vertical axis is the resistance increase rate K of the internal resistance R. The resistance increase rate K can be calculated by the following Formula (3).

$$K = R/Ro \quad (3)$$

Ro: an initial value of an internal resistance (numerical value at each SOC after manufacturing)
R: an internal resistance at each SOC at the end of a standing period As shown in FIG. 12, the resistance increase rate K shows a tendency to increase in the first period W1 corresponding to the first deterioration mode, and also in the second period W2 corresponding to the second deterioration mode. Here, in the first period W1 corresponding to the first deterioration mode, the resistance increase rates K1 and K2 increase in a gentle curve in both the low SOC and the medium SOC, and change amounts are substantially the same.

Whereas, in the second period W2 corresponding to the second deterioration mode, a change amount of the resistance increase rate K is different depending on SOC. That is, while the resistance increase rate K2 at the medium SOC increases in a gentle curve as shown in FIG. 12(B), the resistance increase rate K1 at the low SOC sharply rises as shown in FIG. 12(A), and the change amount of the resistance increase rate K1 at the low SOC is larger than that in the resistance increase rate K2 at the medium SOC.

Therefore, in the present embodiment, the deterioration mode of the lithium ion secondary battery 100 is determined on the basis of the resistance increase rate K1 at the low SOC in the standing period T and the resistance increase rate K2 at the medium SOC in the standing period T.

Specifically, in comparing the resistance increase rates K1 and K2 at the low SOC and the medium SOC for a boundary P between the first period W1 and the second period W2, the resistance increase rate K1 at the low SOC is 131%, the resistance increase rate K2 at the medium SOC is 121%, and a difference in the resistance increase rates (K1-K2) is 10%. Therefore, when a value obtained by subtracting the resistance increase rate K2 at the medium SOC from the resistance increase rate K1 at the low SOC in the standing period T is a determination value 10% or less (in a case of the following Formula (4)), the deterioration mode is determined to be the first deterioration mode. Whereas, when a value obtained by subtracting the resistance increase rate K2 at the medium SOC from the resistance increase rate K1 at the low SOC in the standing period T is larger than the determination value 10% (in a case of the following Formula (5)), the deterioration mode is determined to be the second deterioration mode.

Resistance increase rate $K1$ at low SOC in standing period $T1$−Resistance increase rate $K2$ at medium SOC in standing period $T\leq 10\%$  (4).

Resistance increase rate $K1$ at low SOC in standing period $T1$−Resistance increase rate $K2$ at medium SOC in standing period $T>10\%$  (5)

For example, in a case of a standing period Ta, a resistance increase rate is $K1a$ at the low SOC and a resistance increase rate is $K2a$ at the medium SOC. Since $K1a$-$K2a$ is 10% or less, the deterioration mode is determined to be the first deterioration mode.

Whereas, in a case of a standing period Tb, a resistance increase rate is $K1b$ at the low SOC and a resistance increase rate is $K2b$ at the medium SOC. Then, since $K1a$-$K1b$ is larger than 10%, the deterioration mode is determined to be the second deterioration mode.

Note that "low SOC" means that SOC is in a range of 20% or less, and "medium SOC" means that SOC is in a range of 40% to 60%. In addition, although it is preferable to compare the two resistance increase rates $K1$ and $K2$ at a same temperature and a same standing period T, the temperatures and the standing periods T may not necessarily coincide with each other as long as an error is small.

Note that the SOC 20% is an example of a "first threshold" of the present invention, and the SOC 40% is an example of a "second threshold" of the present invention.

The lithium ion secondary battery 100 has a configuration in which a plurality of cells (four cells in the present embodiment) are in series connection. In the present embodiment, the first deterioration mode is determined in a case where all of the four cells satisfy the condition of (4), and the second deterioration mode determined when any one of the four cells satisfies the condition of (5).

Further, the determination value varies depending on a battery type and a condition such as a temperature. Therefore, it is preferable to preliminarily evaluate the resistance increase rate K1 and K2 of the internal resistance at low SOC and medium SOC at the boundary P of the deterioration mode, in accordance with a battery type and a condition, to determine the numerical value.

7. Switching Process of Correlation Map M

Figure 14:
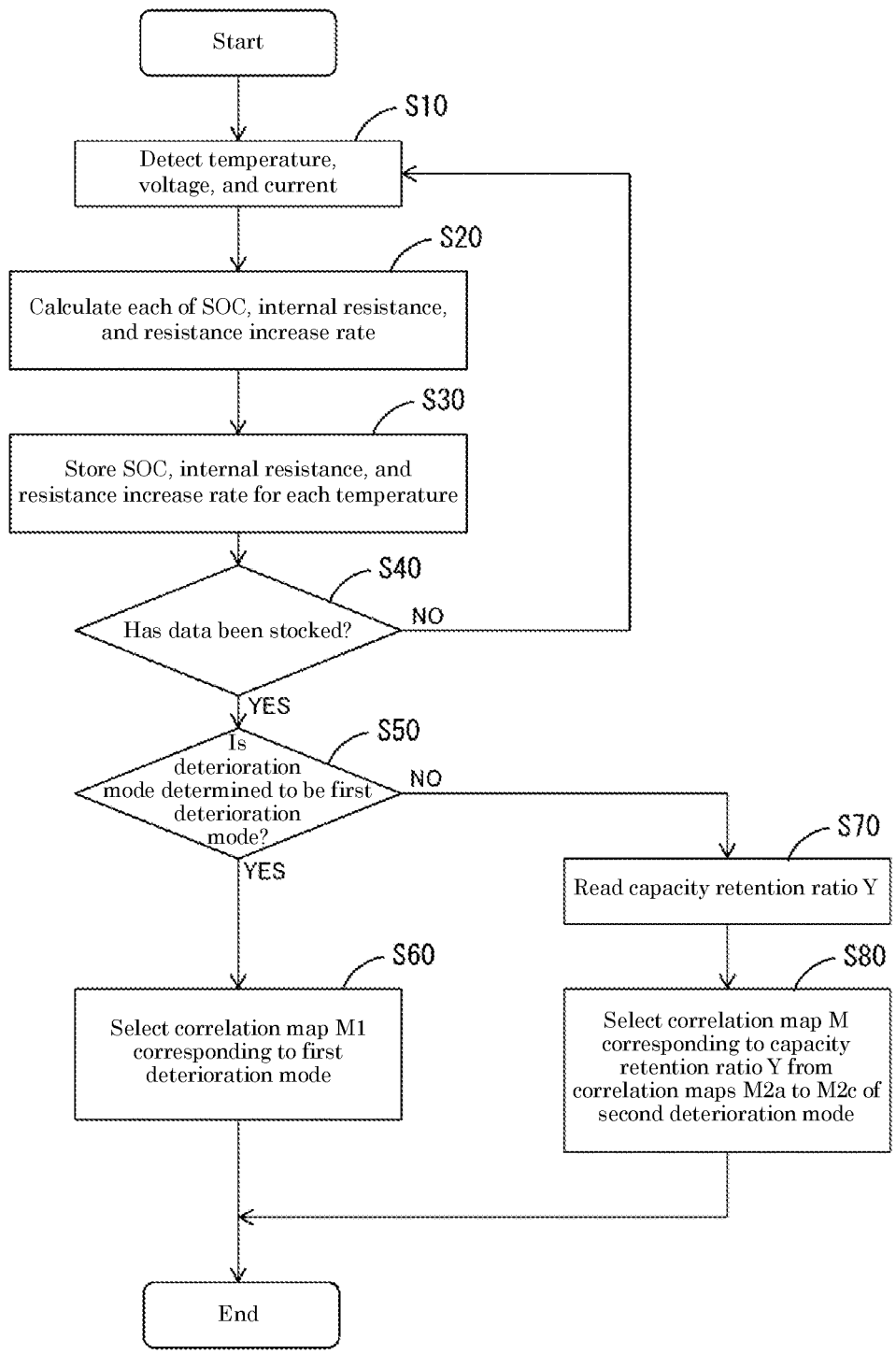
FIG. 14 is a flowchart showing a flow of a switching process of a correlation map.

FIG. 14 is a flowchart of a switching process of a correlation map.

After starting, the data processing unit 71 of the management device 50 detects a temperature of the assembled battery 30 by the temperature sensor 43. Further, the current I flowing through the assembled battery 30 is detected by the current sensor 41, and the voltage V of each lithium ion secondary battery 100 is detected by the voltage detection unit 60. Further, a total voltage of the assembled battery 30 is detected (S10).

Thereafter, the data processing unit 71 performs processing for estimating each of the following data, on the basis of data of the measured current I and voltage V (S20).

(a) SOC of each cell
(b) An internal resistance R of each cell
(c) A resistance increase rate K of the internal resistance R of each cell SOC of (a) can be estimated by the current integration method described above. The internal resistance of (b) can be calculated, for example, by the following Formula (6) (see FIG. 13). The resistance increase rate K can be calculated by substituting a value of the calculated internal resistance R into Formula (3) above.

$$R=(CCV-OCV)/I \tag{6}$$

CCV is a closed circuit voltage of each cell, and OCV is an open circuit voltage of each cell.

Then, after calculating each of the data of (a) to (c), the data processing unit 71 performs processing of storing the data of (a) to (c) in the memory 73 in association with the data of the temperature (S30).

Thereafter, the process flow shifts to S40, and it is determined whether data for determining the deterioration mode is stocked. Specifically, it is determined as being stocked when the data of the internal resistance R of (b) and the data of the resistance increase rate K of (c) are stored for each temperature and each SOC, and determined as not being stocked when not stored.

When the data is not stocked, the processing from S10 to S30 is repeated. As a result, for each cell, the data of the internal resistance R of (b) and the data of the resistance increase rate K of (c) are accumulated for each temperature and each SOC. Then, when the data for determining the deterioration mode is stocked, the process shifts to S50.

Note that the data processing unit 71 calculates the capacity retention ratio Y in the following method during a period in which the processing of S10 to S30 is repeated.

First, the current I detected by the current sensor 41 is integrated at a certain time interval from a certain time t1 to a certain time t2, and at that time, a varied electric quantity Q [Ah] of each cell is obtained. Further, an SOC variation amount D [%] from t1 to t2 is obtained by the OCV method or the like. Then, the available capacity C of each cell is calculated from the electric quantity Q and the SOC variation amount D of each cell.

$$C=Q/D \tag{7}$$

Then, by substituting the calculated available capacity C into the Formula (2), the capacity retention ratio Y of each cell can be obtained. Note that the data of the capacity retention ratio Y is stored in the memory 73 by the data processing unit 71.

Upon shifting to S50, the data processing unit 71 determines the deterioration mode. While the determination method of the deterioration mode is as already explained, the data processing unit 71 makes determination on the basis of the resistance increase rate K1 at the low SOC in the standing period T and the resistance increase rate K2 at the medium SOC in the standing period T.

Specifically, when all the four cells satisfy the condition (4), the data processing unit 71 determines to be the "first deterioration mode" (S50: YES). Note that the processing of S50 corresponds to the "mode determination process, determination step" of the present invention.

Then, when the deterioration mode of each cell is determined to be the "first deterioration mode", the data processing unit 71 accesses the memory 73 and selects the correlation map M1 corresponding to the first deterioration mode (S60).

Therefore, during the first deterioration mode, SOC is estimated by the OCV method using the first correlation map M1. That is, in a state where a current does not flow in each cell, the data processing unit 71 measures OCV of each lithium ion secondary battery 100 by the voltage detection unit 60 (FIG. 15: S100). Then, referring the measured OCV to the correlation map M1, SOC of each cell is calculated (FIG. 15: S110). Note that the processing of S110 corresponds to the "estimation process, estimation step" of the present invention.

Further, the data processing unit 71 repeatedly executes the switching process (S10 to S80) of the correlation map M for each predetermined period. Then, when any one of the four cells satisfies the condition of (5), the data processing unit 71 determines to be the "second deterioration mode" (S50: NO).

Then, when the deterioration mode of each cell is determined to be the "second deterioration mode", the data processing unit 71 accesses the memory 73 and performs processing of reading the data of the capacity retention ratio Y (S70). Specifically, among the capacity retention ratios Y of the four cells, data of a cell having the largest difference in the resistance increase rates K1-K2 is read out. Thereafter, the data processing unit 71 accesses the memory 73 and selects the correlation map M corresponding to the capacity retention ratio Y from the correlation maps M2*a* to M2*c* of the second deterioration mode (S80). For example, when the capacity retention ratio is Ya, the correlation map M2*a* is selected (S80).

Therefore, during the second deterioration mode, SOC is estimated by the OCV method using the second correlation map M2*a* corresponding to the capacity retention ratio Ya. That is, in a state where a current does not flow in each cell, OCV of each lithium ion secondary battery 100 is measured by the voltage detection unit 60 (FIG. 15: S100). Then, by using the measured OCV and referring to the correlation map M2*a*, SOC of each cell is calculated (FIG. 15: S110).

In addition, when the capacity retention ratio Y changes from "Ya" to "Yb" during the second deterioration mode, the data of the correlation map M2*b* is read from the memory 73 by the data processing unit 71 when the processing of S80 is executed, and thereafter, SOC is estimated by the OCV method using the second correlation map M2*b* corresponding to the capacity retention ratio Yb.

8. Description of Effect

In the battery pack 20 disclosed in this embodiment, the correlation map M indicating the correlation between SOC and OCV is switched in accordance with the deterioration mode of each cell. Therefore, it is possible to estimate SOC of each cell with high accuracy.

In particular, the battery pack 20 or the assembled battery 30 using the lithium ion secondary battery 100 as the energy storage device has become widespread in automobile use, and in the future, a situation is assumed in which the assembled battery 30 after being used in automobile use (first use) is removed from the automobile and used for another purpose (second use).

In the second use, since the elapsed time after manufacturing is longer, the deterioration mode is assumed to shift from the first deterioration mode to the second deterioration mode. In the battery pack 20 disclosed in the present embodiment, since the correlation map M indicating the correlation between SOC and OCV is switched in accordance with the deterioration mode, it is possible to estimate SOC of each cell with high accuracy even in another purpose (second use). Even in a case of being used for the same purpose of use, it is possible to accurately estimate SOC of each cell regardless of a use period or a use situation.

Further, in the battery pack 20 disclosed in this embodiment, when it is determined to be the second deterioration mode, the correlation maps M2*a* to M2*c* corresponding to the capacity retention ratios Ya to Yc are selected. Therefore, it is possible to further improve the SOC estimation accuracy of each cell in the second deterioration mode.

Further, as shown in FIGS. 12(A) and 12(B), in the second deterioration mode, the resistance increase rate K1 at the low SOC rises sharply, and the resistance increase rate K1 at the low SOC has a characteristic in which the change amount is larger than that in the resistance increase rate K2 at the medium SOC. Focusing on the point above, the battery pack 20 disclosed in the present embodiment determines the deterioration mode on the basis of the resistance increase rate K1 at the low SOC and the resistance increase rate K2 at the medium SOC. Therefore, it is possible to determine the deterioration mode with high accuracy.

Second Embodiment

A second embodiment of the present invention will be described with reference to FIGS. 17 and 18.

In the first embodiment, as an example of the lithium ion secondary battery 100, the ternary lithium ion secondary battery using a lithium-containing metal oxide containing elements of Co, Mn, and Ni as the positive active material and using hard carbon as the negative electrode has been exemplified.

In the second embodiment, a ternary lithium ion secondary battery 100A is exemplified in which a negative electrode material is different from the lithium ion secondary battery 100 of the first embodiment, and a lithium-containing metal oxide containing elements of Co, Mn, and Ni is used as a positive active material and graphite is used as a negative electrode.

Figure 17:
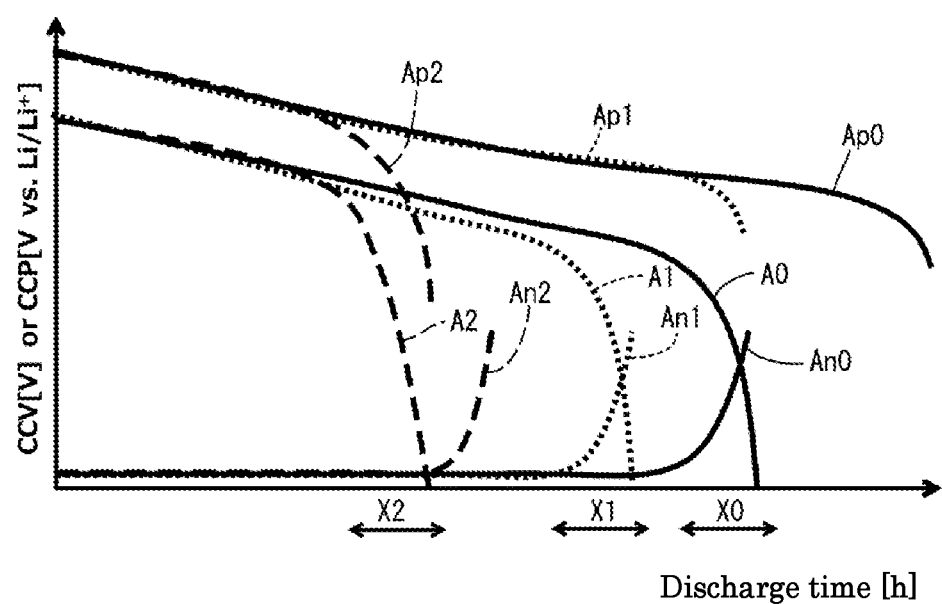
FIG. 17 is a graph showing changes in CCV and CCP with respect to a discharge time for a lithium ion secondary battery according to a second embodiment.

FIG. 17 is a graph in which a horizontal axis is a discharge period [h], a vertical axis is CCV [V], CCP [V] of a positive electrode, and CCP [V] of a negative electrode, and the graph is obtained by conducting a constant current discharge test at a rate of 1 C on each lithium ion secondary battery 100A in an initial stage, a first deterioration mode, and a second deterioration mode.

Note that FIG. 17 corresponds to FIG. 8 of the first embodiment, and a curve A0, a curve Ap0, and a curve An0 respectively indicate a curve of CCV, a curve of CCP of the positive electrode, and a curve of CCP of the negative electrode, for the lithium ion secondary battery 100A in the initial stage.

Further, a curve A1, a curve Ap1, and a curve An1 respectively indicate a curve of CCV, a curve of CCP of the positive electrode, and a curve of CCP of the negative electrode, for the lithium ion secondary battery 100A in the first deterioration mode. A curve A2, a curve Ap2, and a curve An2 respectively indicate a curve of CCV, a curve of CCP of the positive electrode, and a curve of CCP of the negative electrode, for the lithium ion secondary battery 100A in the second deterioration mode.

Also in the ternary lithium ion secondary battery 100A using graphite as the negative electrode, similarly to the case where the negative electrode is hard carbon, CCP of the negative electrode sharply changes greatly at the end of discharge X1 (curve An1) in the first deterioration mode. Whereas, in the second deterioration mode, CCP of the positive electrode sharply drops at the end of discharge X2 (curve Ap2). Therefore, there are the first deterioration mode in which an available capacity is rate-determined by a resistance of the negative electrode, and the second deterioration mode in which an available capacity is rate-determined by a resistance of the positive electrode.

Figure 18:
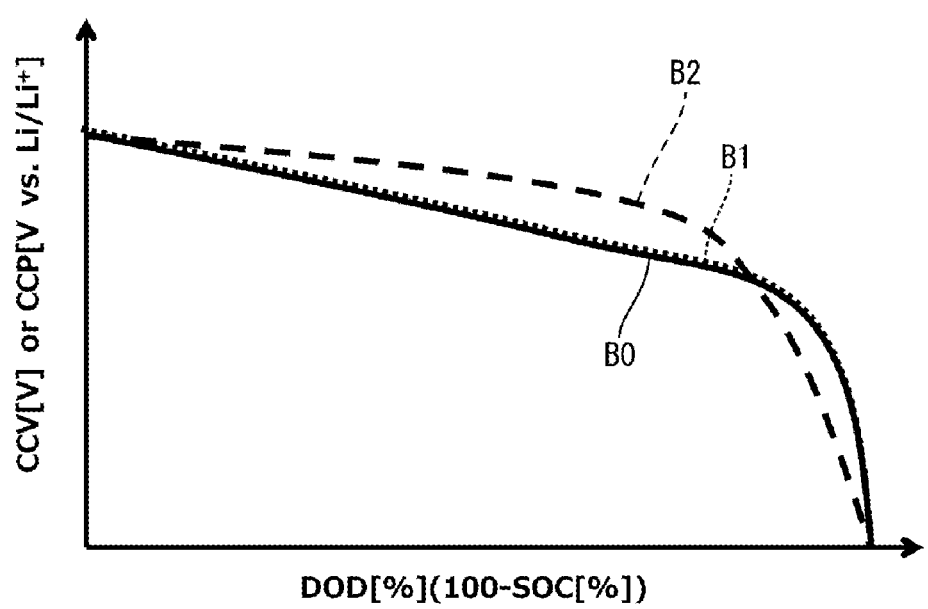
FIG. 18 is a graph showing a change in CCV with respect to DOD.

FIG. 18 is a DOD-CCV correlation graph in which a horizontal axis is DOD [%] and a vertical axis is CCV [V]. Note that the graph of FIG. 18 is obtained by conducting a discharge test in which the ternary lithium ion secondary battery 100A using graphite as the negative electrode is subjected to constant current discharge at a low rate.

The discharge test is conducted for the secondary battery 100 in each of the initial stage, the first deterioration mode, and the second deterioration mode, and "B0" indicates a DOD-CCV correlation curve of the initial product. "B1"

indicates a DOD-CCV correlation curve in the first deterioration mode, and "B2" indicates a DOD-CCV correlation curve in the second deterioration mode.

As shown in FIG. 18, the DOD-CCV correlation curve B2 of the second deterioration mode is different from the DOD-CCV correlation curve B1 of the first deterioration mode. As described in the first embodiment, transition of DOD-CCV is almost equal to transition of DOD-OCV under such a low-rate condition that an internal resistance R is very small and the internal resistance does not significantly change during the test, during discharge from a fully charged state. Therefore, when the deterioration mode is different, the curve of the SOC-OCV characteristic of the lithium ion secondary battery 100 becomes different.

Therefore, similarly to the first embodiment, the ternary lithium ion secondary battery 100A using graphite as the negative electrode can also improve estimation accuracy of SOC, by switching the correlation map M indicating the correlation of SOC-OCV in accordance with the deterioration mode.

Other Embodiments

The present invention is not limited to the embodiments described by the above description and drawings, and the following embodiments, for example, are also included in the technical scope of the present invention.

(1) In the first and second embodiments described above, the ternary lithium ion secondary battery has been exemplified as the "energy storage device". The present invention is widely applicable as long as it is a lithium ion secondary battery having a characteristic including the first deterioration mode in which an available capacity is rate-determined by a resistance of the negative electrode and the second deterioration mode in which an available capacity is rate-determined by a resistance of the positive electrode. For example, it is applicable to an iron phosphate lithium ion secondary battery using lithium iron phosphate (LiFePO$_4$) as the positive active material and carbon or graphite as the negative active material. Further, for example, as the positive active material of the lithium ion secondary battery, it is preferable to use a lithium transition metal oxide and the like, such as LiNi$_{1/3}$Co$_{1/3}$Mn$_{1/3}$, having a layered structure such as Li$_{1+x}$M$_{1-y}$O$_2$ (M is one or two types or more of transition metal elements selected from Fe, Ni, Mn, Co, and the like, and 0≤x<1/3, 0≤y<1/3). Further, a two phase reaction active material may be used. Specifically, the positive active material is a material represented by the general formula LiMPO$_4$, and M may be any one of Fe, Mn, Cr, Co, Ni, V, Mo, and Mg. Further, examples of the negative active material include, in addition to lithium alloys (lithium-silicon, lithium-aluminum, lithium-lead, lithium-tin, lithium-aluminum-tin, lithium-gallium, and lithium metal-containing alloys with wood alloy), an alloy capable of occlusion and release of lithium, a carbon material (e.g., graphite, hardly graphitizable carbon, easily graphitizable carbon, low-temperature fired carbon, amorphous carbon, and the like), silicon oxide, metal oxide, lithium metal oxide (Li$_4$Ti$_6$O$_{12}$ and the like), polyphosphoric acid compound, and the like.

Further, as long as the energy storage device has a characteristic including the first deterioration mode in which an available capacity is rate-determined by a resistance of the negative electrode, and the second deterioration mode in which an available capacity is rate-determined by a resistance of the positive electrode, it is applicable to a secondary battery other than a lithium ion secondary battery, a capacitor, and the like.

(2) In the first and second embodiments described above, the example has been shown in which the correlation maps M2a to M2b corresponding to the capacity retention ratios Ya to Yb are selected when the second deterioration mode is determined, but the selection of the correlation map M in accordance with the capacity retention ratio Y is an optional processing, and the configuration is sufficient in which the correlation maps M1 and M2 are selected at least in accordance with the deterioration mode.

Figure 19:
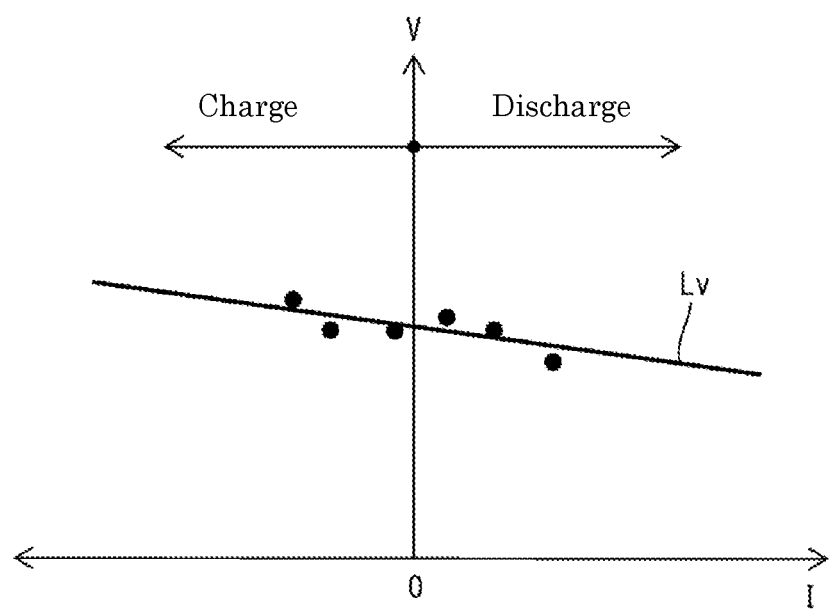
FIG. 19 is a graph showing a change in a voltage with respect to a current of the lithium secondary battery.

(3) In the first and second embodiments described above, the example has been shown in which the internal resistance R of the lithium ion secondary battery 100 is calculated on the basis of the Formula (6), but the internal resistance R may be obtained by another calculation method from a measured value of the current I flowing through the assembled battery 30 and the voltage V of each lithium ion secondary battery 100. For example, during charge or discharge, the current I and the voltage V may be measured for a plurality of times to determine a straight line Lv indicating a change of the voltage V with respect to the current I, and an inclination of the straight line Lv (internal resistance R) may be obtained. In the example of FIG. 19, the current I of the assembled battery 30 and the voltage V of the lithium ion secondary battery 100 are measured, and the straight line Lv indicating a change of the voltage V with respect to the current I is obtained from the obtained measured values I and V.

Figures 15, 16:
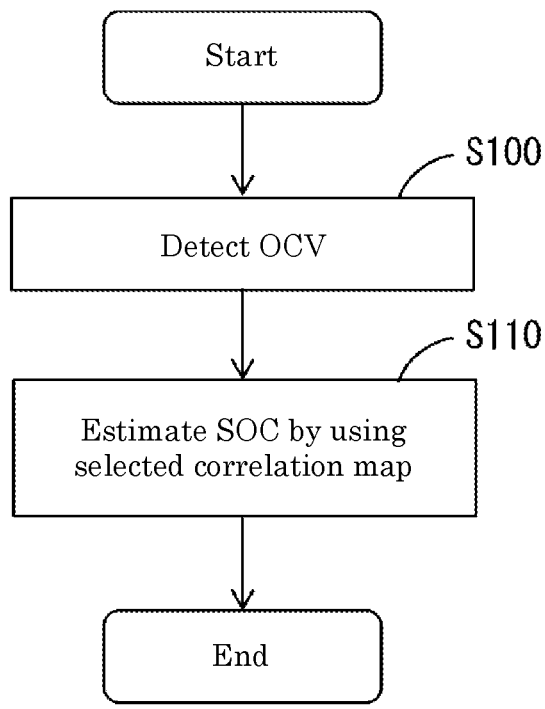
FIG. 15 is a flowchart of an SOC calculation process by an OCV method.
FIG. 16 is a view showing a correlation map between OCV and SOC.

(4) In the first and second embodiments described above, the example has been shown in which the correlation data of SOC-OCV shown in FIG. 10 is held as the correlation map M shown in FIG. 16. However, for example, a configuration may be adopted in which the graph of FIG. 10 is held by an approximate expression. As the approximate expression, an n-th order function such as a cubic function, which is represented by the following Formula (8), can be exemplified.

$$OCV = a \times SOC^3 + b \times SOC^2 + c \times SOC + d \quad (8)$$

a to d are coefficients.

Alternatively, as represented by the Formula (9), an approximate expression based on a theory such as the Nernst equation may be used.

$$OCV = EO + k1 \times \ln(SOC) + k2 \times \ln(1-SOC) - k3/SOC - k4 \times SOC \quad (9)$$

EO is a standard electrode battery, and k1 to k4 are coefficients.

(5) In the first and second embodiments described above, the configuration has been exemplified in which the deterioration mode is determined on the basis of the resistance increase rate K1 at low SOC and the resistance increase rate K2 at medium SOC. The resistance increase rates at medium SOC and at high SOC are substantially the same. Therefore, a configuration may be adopted in which the deterioration mode is determined on the basis of the resistance increase rate at low SOC and the resistance increase rate at high SOC in which SOC is higher than that in medium SOC. Further, in addition to this, as described in Patent Document 2 (JP-A-2014-109477), the deterioration mode may be determined by comparing magnitude of a second current-carrying capacity with a threshold value. Note that the second current-carrying capacity is magnitude of a change in a current-carrying capacity with respect to a first capacity change quantity, in a case where magnitude of a change in a current-carrying capacity with respect to a voltage when the energy storage device is charged or discharged is defined as the first capacity change quantity.

(6) In the example of FIG. 1, the management device 50 is disposed inside the case that accommodates the energy storage device 100 or the assembled battery 30, but the present invention is not limited to this example. The management device 50 or a part of the management device 50 (e.g., the control unit 70) may be disposed at a location distant from the energy storage device 100 (the assembled battery 30). For example, a control unit provided in a vehicle may function as the SOC estimation device of the energy storage device. A control unit provided in a battery inspection device may function as the SOC estimation device of the energy storage device.

The present invention may be implemented in the following mode.

(Example 1) In an SOC estimation device of an energy storage device, the SOC estimation device includes a storage unit and a data processing unit; the energy storage device has a characteristic including a first deterioration mode in which a capacity drop with respect to time indicates a first transition, and a second deterioration mode in which a capacity drop indicates a second transition; the storage unit holds first correlation data indicating a correlation between SOC and OCV of the energy storage device in the first deterioration mode, and second correlation data indicating a correlation between SOC and OCV of the energy storage device in the second deterioration mode; and the data processing unit executes a mode determination process of determining a deterioration mode of the energy storage device, and an estimation process of selecting correlation data corresponding to the deterioration mode from the storage unit, to estimate SOC of the energy storage device.

(Example 2) The SOC estimation device according to Example 1, wherein the data processing unit determines a deterioration mode of the energy storage device based on an internal resistance of the energy storage device in the mode determination process.

(Example 3) The SOC estimation device according to Example 2, wherein the data processing unit determines a deterioration mode of the energy storage device in the mode determination process, based on a resistance increase rate of an internal resistance of the energy storage device when SOC is lower than a first threshold, and based on a resistance increase rate of an internal resistance of the energy storage device when SOC is higher than a second threshold larger than the first threshold.

(Example 4) The SOC estimation device according to any one of Examples 1 to 3, wherein the second deterioration mode is a deterioration mode in which a capacity drop is larger than that in the first deterioration mode, and a correlation of SOC-OCV is different in accordance with a capacity retention ratio; the storage unit holds correlation data indicating a correlation between SOC and OCV of the energy storage device for each capacity retention ratio of the energy storage device, for the second deterioration mode; and when the energy storage device is determined to be in the second deterioration mode, the data processing unit selects correlation data corresponding to a capacity retention ratio, to estimate SOC of the energy storage device.

(Example 5) The SOC estimation device according to any one of the Examples 1 to 4, wherein the data processing unit calculates an internal resistance of the energy storage device based on a measured value of a voltage and a current of the energy storage device.

(Example 6) The SOC estimation device according to any one of Examples 1 to 5, wherein the storage unit holds the first correlation data and the second correlation data by a correlation map or an approximate expression indicating a correlation between SOC and OCV of the energy storage device.

(Example 7) An energy storage apparatus including an energy storage device and the SOC estimation device according to any one of Examples 1 to 4.

(Example 8) An SOC estimation method for an energy storage device, wherein the energy storage device has a characteristic including a first deterioration mode in which a capacity drop with respect to time indicates a first transition, and a second deterioration mode in which a capacity drop indicates a second transition, the SOC estimation method including a mode determination step of determining a deterioration mode of the energy storage device, and an estimation step of selecting correlation data corresponding to the deterioration mode from a plurality of correlation data indicating a correlation of SOC and OCV of the energy storage device, to estimate SOC of the energy storage device.

(Example 9) The SOC estimation device according to Example 1, wherein the data processing unit predicts in advance that a deterioration mode of the energy storage device shifts from the first deterioration mode to the second deterioration mode in the mode determination process, or detects the fact immediately after the deterioration mode shifts to the second deterioration mode. For example, the technique of JP-A-2016-80477 may be applied.

(Example 10) The SOC estimation device according to Example 1, wherein the data processing unit determines a deterioration mode of the energy storage device based on a CCP transition of a positive electrode and a negative electrode of the energy storage device in the mode determination process.

DESCRIPTION OF REFERENCE SIGNS

20: . . . Battery pack (example of "energy storage apparatus" of the present invention)
30: . . . Assembled battery
41: . . . Current sensor
43: . . . Temperature sensor
50: . . . Management unit (example of "soc estimation device" of the present invention)
60: . . . Voltage detection circuit
71: . . . Data processing unit
73: . . . Memory (example of "storage unit" of the present invention)
100: . . . Lithium ion secondary battery (example of "energy storage device" of the present invention)

The invention claimed is:

1. An SOC estimation device for an energy storage device, the SOC estimation device comprising:
   a storage unit; and
   a data processing unit,
   wherein
   the energy storage device has a characteristic including a
      first deterioration mode in which a capacity drop with respect to time indicates a first transition, and a second deterioration mode in which a capacity drop indicates a second transition,
   the storage unit holds:
      first correlation data indicating a correlation between SOC and OCV of the energy storage device in the first deterioration mode in which an available capacity is determined by a resistance of a negative electrode of the energy storage device, and second correlation data indicating a correlation between SOC and OCV of the energy storage device in the second deterioration mode in which an available capacity is determined by a resistance of a positive electrode of the energy storage device, and the data processing unit executes:

a mode determination process of determining a deterioration mode of the energy storage device, and an estimation process of selecting correlation data corresponding to the deterioration mode from the storage unit, to estimate SOC of the energy storage device.

2. The SOC estimation device according to claim 1, wherein the data processing unit determines a deterioration mode of the energy storage device based on an internal resistance of the energy storage device in the mode determination process.

3. The SOC estimation device according to claim 2, wherein the data processing unit determines, in the mode determination process, a deterioration mode of the energy storage device based on a first resistance increase rate of an internal resistance of the energy storage device when SOC is lower than a first threshold, and based on a second resistance increase rate of an internal resistance of the energy storage device when SOC is higher than a second threshold larger than the first threshold.

4. The SOC estimation device according to claim 1, wherein:

the second deterioration mode is a deterioration mode in which a capacity drop is larger than a capacity drop in the first deterioration mode, and a correlation of SOC-OCV is different in accordance with a capacity retention ratio, the storage unit holds correlation data indicating a correlation between SOC and OCV of the energy storage device for each capacity retention ratio of the energy storage device, for the second deterioration mode, and when the energy storage device is determined to be in the second deterioration mode, the data processing unit selects correlation data corresponding to a capacity retention ratio, to estimate SOC of the energy storage device.

5. The SOC estimation device according to claim 1, wherein the data processing unit calculates an internal resistance of the energy storage device based on a measured value of a voltage and a current of the energy storage device.

6. The SOC estimation device according to claim 1, wherein the storage unit holds the first correlation data and the second correlation data by a correlation map or an approximate expression indicating the correlation between SOC and OCV of the energy storage device.

7. An energy storage apparatus comprising:

an energy storage device; and the SOC estimation device according to claim 1.

8. An SOC estimation method for an energy storage device, wherein the energy storage device has a characteristic including a first deterioration mode in which a capacity drop with respect to time indicates a first transition, and a second deterioration mode in which a capacity drop indicates a second transition, the SOC estimation method comprising:

a mode determination step of determining a deterioration mode of the energy storage device; and an estimation step of selecting correlation data corresponding to the deterioration mode from a plurality of correlation data indicating a correlation of SOC and OCV of the energy storage device, to estimate SOC of the energy storage device, wherein an available capacity of the energy storage device in the first deterioration mode is determined by a resistance of a negative electrode of the energy storage device, and wherein an available capacity of the energy storage device in the second deterioration mode is determined by a resistance of a positive electrode of the energy storage device.

9. An SOC estimation device for an energy storage device, the SOC estimation device comprising:

a storage unit; and a data processing unit, wherein the energy storage device comprises a first deterioration mode in which a capacity drops at a first transition rate, and a second deterioration mode in which a capacity drops at a second transition rate, the storage unit is configured to store:

first correlation data indicating a correlation between SOC and OCV of the energy storage device in the first deterioration mode in which an available capacity is determined by a resistance of a negative electrode of the energy storage device, and second correlation data indicating a correlation between SOC and OCV of the energy storage device in the second deterioration mode in which an available capacity is determined by a resistance of a positive electrode of the energy storage device, and the data processing unit is configured to execute:

a mode determination process of determining a deterioration mode of the energy storage device based on a first resistance increase rate of an internal resistance of the energy storage device when SOC is lower than a first threshold, and based on a resistance increase rate of an internal resistance of the energy storage device when SOC is higher than a second threshold larger than the first threshold, and an estimation process of selecting correlation data corresponding to the deterioration mode from the storage unit, to estimate SOC of the energy storage device.

10. The SOC estimation device according to claim 9, wherein:

the second deterioration mode is a deterioration mode in which a capacity drop is larger than a capacity drop in the first deterioration mode, and a correlation of SOC-OCV is different in accordance with a capacity retention ratio, the storage unit holds correlation data indicating a correlation between SOC and OCV of the energy storage device for each capacity retention ratio of the energy storage device, for the second deterioration mode, and when the energy storage device is determined to be in the second deterioration mode, the data processing unit selects correlation data corresponding to a capacity retention ratio, to estimate SOC of the energy storage device.

11. The SOC estimation device according to claim 9, wherein the data processing unit calculates an internal resistance of the energy storage device based on a measured value of a voltage and a current of the energy storage device.

12. The SOC estimation device according to claim 9, wherein the storage unit holds the first correlation data and the second correlation data by a correlation map or an approximate expression indicating the correlation between SOC and OCV of the energy storage device.

13. An energy storage apparatus comprising:
   an energy storage device; and
   the SOC estimation device according to claim 9.

* * * * *